United States Patent
Artman et al.

(10) Patent No.: US 11,058,027 B2
(45) Date of Patent: Jul. 6, 2021

(54) SYSTEMS AND METHODS FOR CONTROLLING AIR DISTRIBUTION TO ELECTRONIC COMPONENTS

(71) Applicant: Lenovo Enterprise Solutions (Singapore) Pte. Ltd., New Tech Park (SG)

(72) Inventors: Paul Artman, Research Triangle Park, NC (US); Vinod Kamath, Raleigh, NC (US)

(73) Assignee: Lenovo Enterprises Solutions (Singapore) Pte. Ltd., New Tech Park (SG)

( * ) Notice: Subject to any disclaimer, the term of this patent is extended or adjusted under 35 U.S.C. 154(b) by 83 days.

(21) Appl. No.: 16/373,699

(22) Filed: Apr. 3, 2019

(65) Prior Publication Data

US 2020/0323102 A1 Oct. 8, 2020

(51) Int. Cl.
*H05K 7/20* (2006.01)
*G05B 19/042* (2006.01)

(52) U.S. Cl.
CPC ....... *H05K 7/20209* (2013.01); *G05B 19/042* (2013.01); *H05K 7/20172* (2013.01); *H05K 7/20736* (2013.01); *H05K 7/20836* (2013.01); *G05B 2219/2614* (2013.01)

(58) Field of Classification Search
CPC .............. G05B 19/042; G05B 19/0426; G05B 2219/2614; H05K 7/20172; H05K 7/20209; H05K 7/20727; H05K 7/20736; H05K 7/20836
See application file for complete search history.

(56) References Cited

U.S. PATENT DOCUMENTS

| | | | | |
|---|---|---|---|---|
| 5,249,741 A * | 10/1993 | Bistline | ............. | G05D 23/1906 165/80.3 |
| 7,987,024 B2 * | 7/2011 | Tunks | ..................... | G06F 1/206 700/299 |
| 2005/0081542 A1 * | 4/2005 | Braun | ..................... | F01P 7/048 62/186 |
| 2006/0203449 A1 * | 9/2006 | Honma | .................. | H05K 7/207 361/695 |
| 2007/0271477 A1 * | 11/2007 | Brewer | ................. | G06F 1/3203 713/324 |
| 2008/0320323 A1 * | 12/2008 | Brittain | .................. | G11C 5/143 713/340 |
| 2012/0078420 A1 * | 3/2012 | Jensen | ..................... | G06F 1/206 700/275 |
| 2012/0215359 A1 * | 8/2012 | Michael | .................. | G06F 1/206 700/275 |
| 2014/0032011 A1 * | 1/2014 | Artman | ............... | G05D 23/1931 700/300 |
| 2015/0105010 A1 | 4/2015 | Zou | | |
| 2016/0239067 A1 * | 8/2016 | Lovicott | ................. | G06F 1/206 |
| 2017/0102744 A1 * | 4/2017 | Haley | ...................... | G06F 1/206 |
| 2018/0011521 A1 * | 1/2018 | Ingalls | ..................... | F24F 11/76 |
| 2019/0239385 A1 * | 8/2019 | Chen | ...................... | G06F 1/3221 |
| 2019/0391624 A1 * | 12/2019 | Yao | ........................ | G06F 1/1694 |

* cited by examiner

*Primary Examiner* — Jennifer L Norton
(74) *Attorney, Agent, or Firm* — Olive Law Group, PLLC

(57) ABSTRACT

Systems and methods for controlling air distribution to electronic components are disclosed. According to an aspect, a system includes fans configured to distribute air to a plurality of electronic components. The system also includes a fan controller configured to control the fans based on a form factor and/or a quantity of the electronic components.

16 Claims, 4 Drawing Sheets

SYSTEMS AND METHODS FOR CONTROLLING AIR DISTRIBUTION TO ELECTRONIC COMPONENTS

TECHNICAL FIELD

The presently disclosed subject matter relates to thermal controllers in computing devices. Particularly, the presently disclosed subject matter relates to systems and methods for controlling air distribution to electronic components.

BACKGROUND

Computers consume electrical energy and generate heat. Many computers include fans to generate airflow for removing heat. Removing heat from a computer helps to control internal temperatures, to maintain system reliability, performance, and longevity. Rack-mounted computers, such as those in data centers or server farms, typically include several servers and other equipment arranged within a rack, thus generating the combined heat of the servers and other equipment in the rack. A server may include multiple fans arranged internally that together can generate a large amount of noise, require a large amount of power, and reduce component reliability. This can be particularly problematic at a data center having many servers such that these problems become compounded.

Some cooling systems in computing devices, such as servers, have closed loop control in which temperatures of the electronic components within the computing device are read by a baseboard management controller ("BMC"). However, in many servers, storage devices are positioned at the front and therefore have a large impact on system impedance, airflow, and downstream component heating. In these cases, the closed loop fan speed response typically does not sufficiently reduce system cooling power and sound emission.

In view of the foregoing, there is a continuing need for systems and techniques that provide improved thermal control efficiency while ensuring electronic component reliability and reducing system cooling power and sound emission.

BRIEF DESCRIPTION OF THE DRAWINGS

Figure 1:
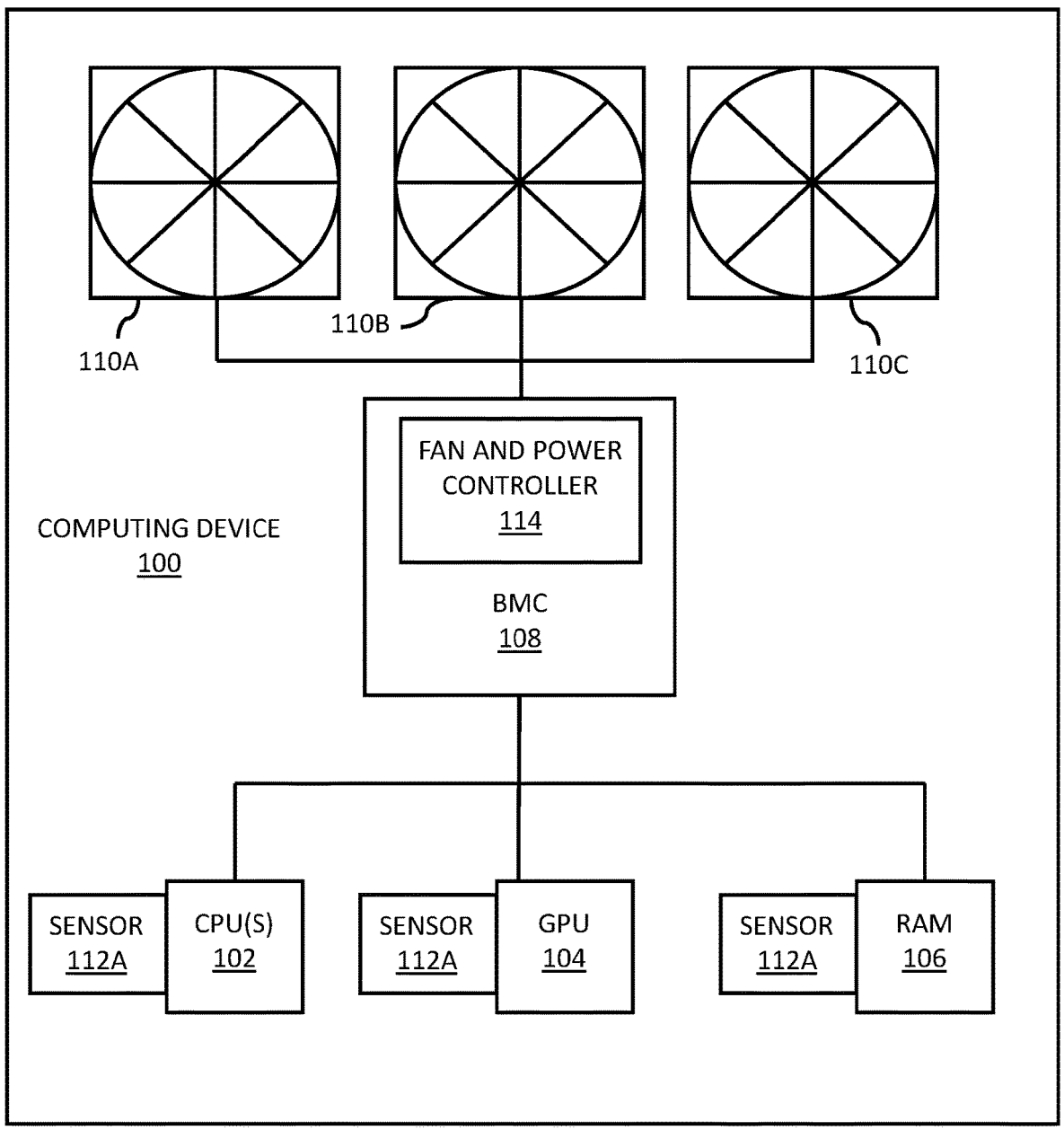
Figure 2:
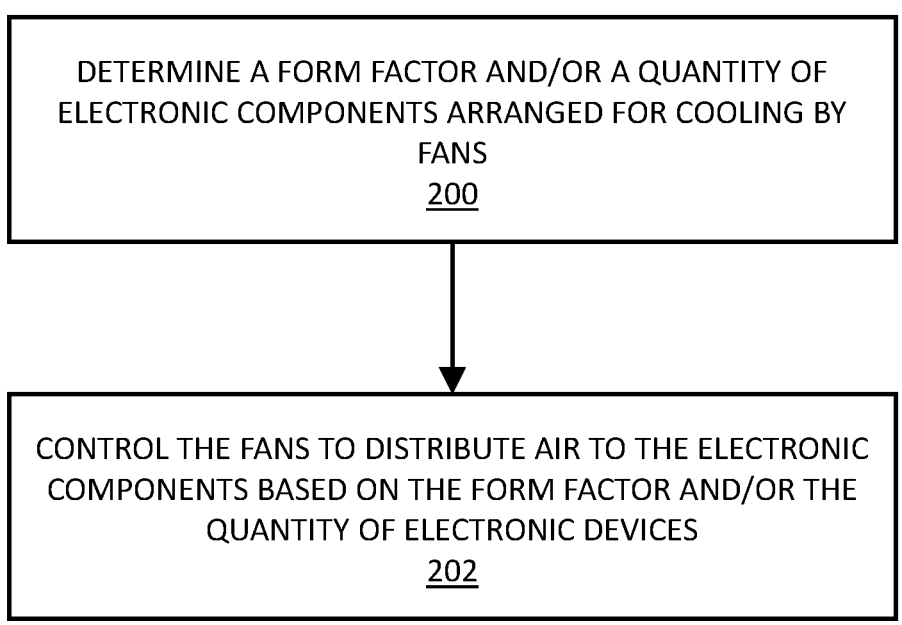
Figure 3:
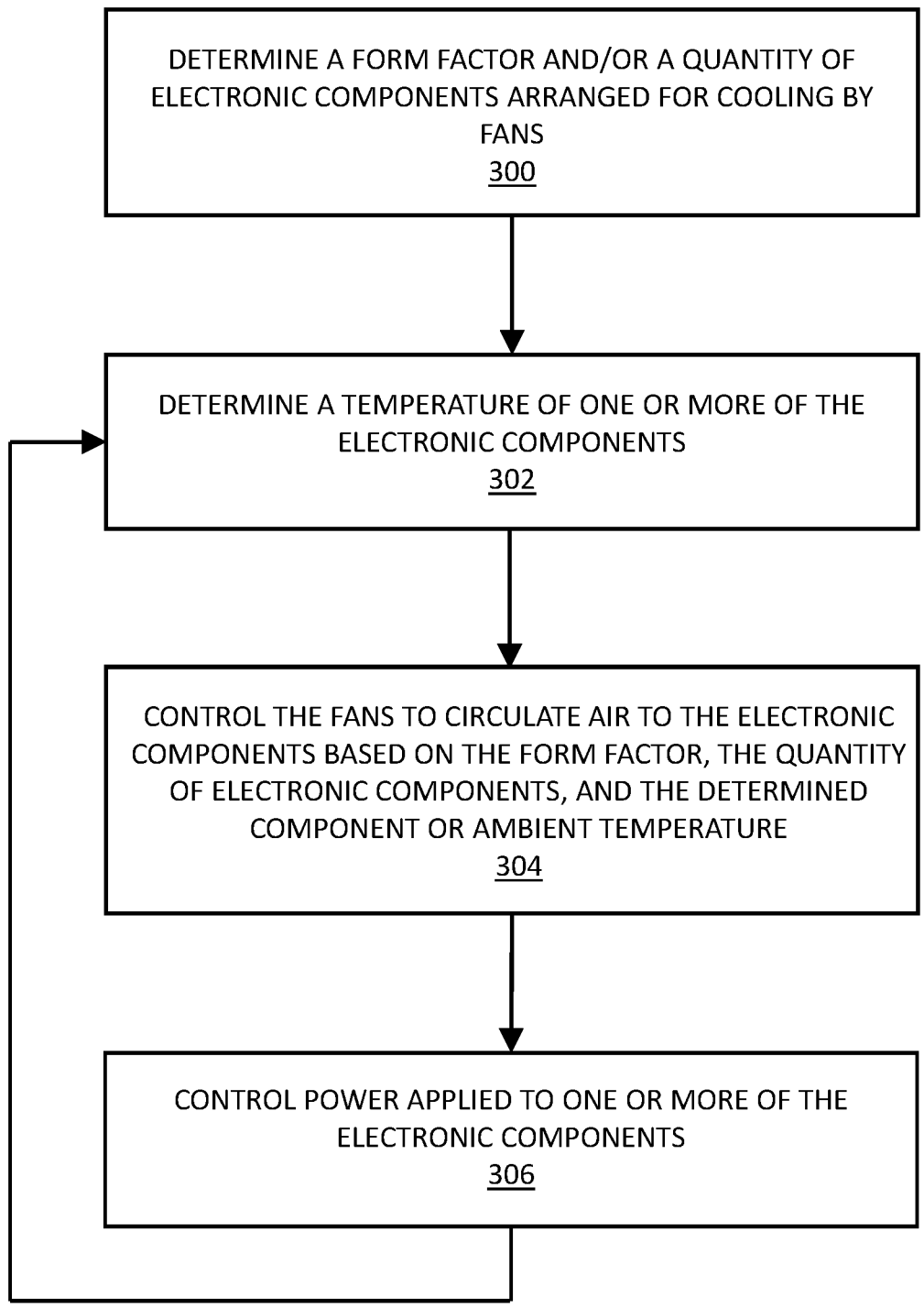
Figure 4:
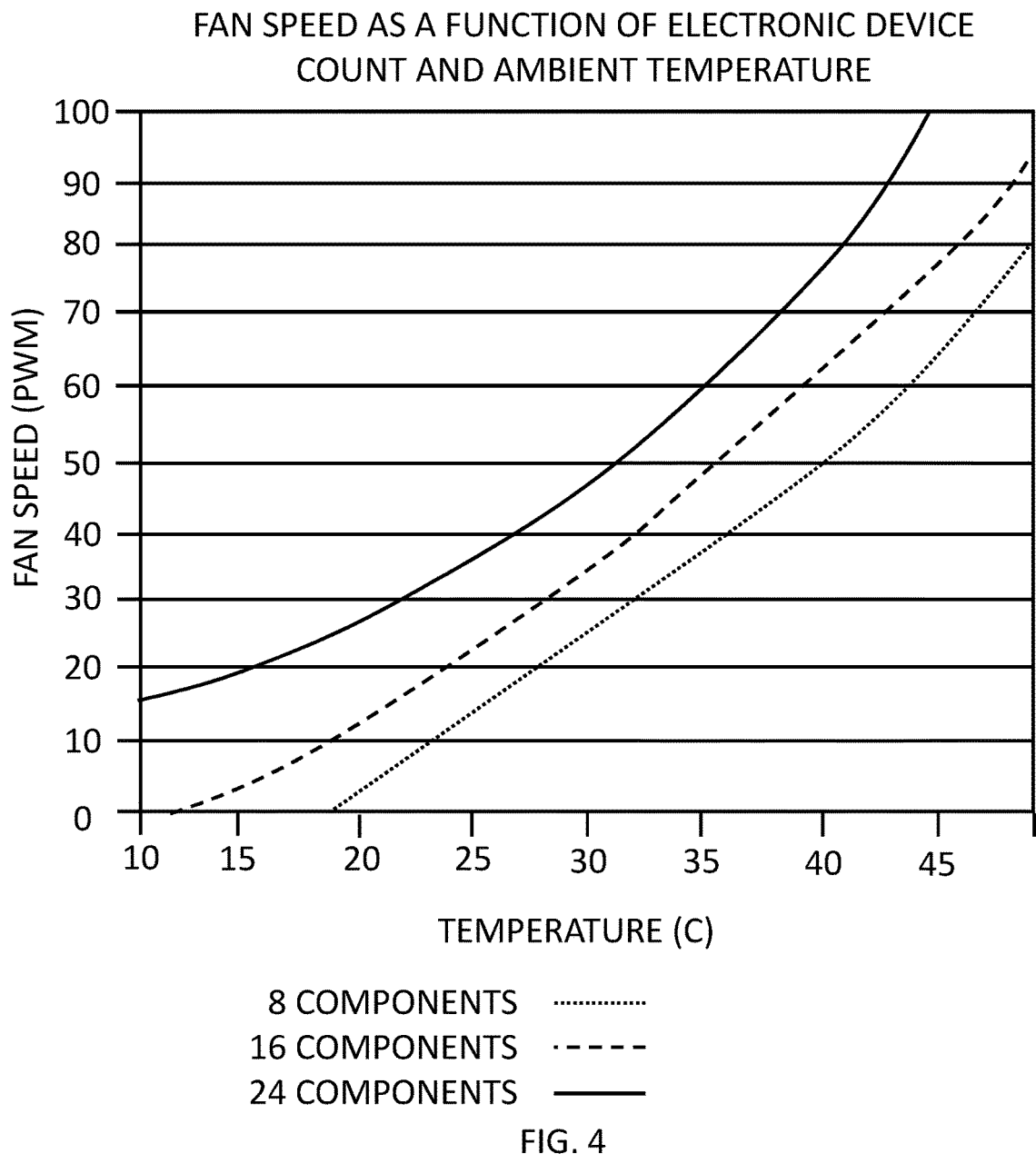

Having thus described the presently disclosed subject matter in general terms, reference will now be made to the accompanying Drawings, which are not necessarily drawn to scale, and wherein:

FIG. 1 is a block diagram of an example computing device for controlling air distribution to electronic components in accordance with embodiments of the present disclosure;

FIG. 2 is a flow chart of an example method for controlling a fan based on a form factor and/or a quantity of electronic components in accordance with embodiments of the present disclosure;

FIG. 3 is a flow chart of an example method for controlling a fan based on a form factor, a quantity of electronic components, and temperature of electronic components in accordance with embodiments of the present disclosure; and FIG. 4 is a graph depicting fan speed as a function of electronic component count and ambient temperature in accordance with embodiments of the present disclosure.

SUMMARY

Disclosed herein are systems and methods for initializing computing device bus lanes during boot. According to an aspect, a system includes fans configured to distribute air to electronic components. Further, the system includes a fan controller configured to control the fans based on a quantity of the electronic components.

DETAILED DESCRIPTION

The following detailed description is made with reference to the figures. Exemplary embodiments are described to illustrate the disclosure, not to limit its scope, which is defined by the claims. Those of ordinary skill in the art will recognize a number of equivalent variations in the description that follows.

Articles "a" and "an" are used herein to refer to one or to more than one (i.e. at least one) of the grammatical object of the article. By way of example, "an element" means at least one element and can include more than one element.

"About" is used to provide flexibility to a numerical endpoint by providing that a given value may be "slightly above" or "slightly below" the endpoint without affecting the desired result.

The use herein of the terms "including," "comprising," or "having," and variations thereof is meant to encompass the elements listed thereafter and equivalents thereof as well as additional elements. Embodiments recited as "including," "comprising," or "having" certain elements are also contemplated as "consisting essentially of" and "consisting" of those certain elements.

Recitation of ranges of values herein are merely intended to serve as a shorthand method of referring individually to each separate value falling within the range, unless otherwise indicated herein, and each separate value is incorporated into the specification as if it were individually recited herein. For example, if a range is stated as between 1%-50%, it is intended that values such as between 2%-40%, 10%-30%, or 1%-3%, etc. are expressly enumerated in this specification. These are only examples of what is specifically intended, and all possible combinations of numerical values between and including the lowest value and the highest value enumerated are to be considered to be expressly stated in this disclosure.

Unless otherwise defined, all technical terms used herein have the same meaning as commonly understood by one of ordinary skill in the art to which this disclosure belongs.

As used to herein, the term "electronic component" or "device" may refer to any electrically-based discrete device in an electronic system. For example, a server or other computing device may include numerous electronic components that cooperate together. Typically, electronic components have a number of electrical terminals or leads for connection to other components via buses or other electrical pathways. Example electronic components include, but are not limited to, read only memory (ROM), random access memory (RAM), non-volatile random access memory (NVRAM), a storage device, a processor, an input/output (I/O) component, a redundant array of independent disks (RAID) controller, a serial attached small computer system interface (SCSI) (SAS) hard disk drive (HDD), a solid state drive (SSD), a central processing unit (CPU), an electronic chipset, peripheral component interconnect express (PCIe) card, a serial ATA (SATA) drive, a non-volatile memory express (NVMe) drive, dynamic random access memory (DRAM) a power supply unit (PSU), application-specific integrated circuit (ASIC), field-programmable gate array (FPGA), and a graphics processing unit (GPU).

As used herein, the term "form factor" may refer to, for example, the size, configuration, or physical arrangement of the electronic components of a computing device. Further, the term may be used in describing the size and/or arrangement of other components of a computing device such as its chassis or its internal structural and electronic components either alone or in combination with one another.

As referred to herein, the term "computing device" should be broadly construed. It can include any type of device including hardware, software, firmware, the like, and combinations thereof. A computing device may include one or more processors and memory or other suitable non-transitory, computer readable storage medium having computer readable program code for implementing methods in accordance with embodiments of the present disclosure. A computing device may be a server or any other type of computing device. For example, a computing device can be any type of conventional computer such as a laptop computer or a tablet computer.

FIG. 1 illustrates a block diagram of a computing device 100 for controlling air distribution to electronic components in accordance with embodiments of the present disclosure. In this example, the computing device 100 is a server, although it may alternatively be any other suitable type of computing device. The computing device 100 includes one or more CPUs 102, a GPU 104, RAM 106, a BMC 108, multiple fans 110A-110C, and temperature sensors 112A-112C. It should be understood that the electronic components shown in FIG. 1 are examples, and in other embodiments the computing device 100 may include additional and/or different electronic components arranged in different configurations or numbers. The electronic components of the computing device 100 may be operatively connected together for communication through a high speed bus.

Some or all of the electronic components of the computing device 100 may generate heat during operation and may have a temperature range for optimal or acceptable operation. Fans 110A-110C may be controlled to operate at a variable spped for cooling the electronic components. In an example, the BMC 108 may drive the fans 110A-110C by a pulse-width modulation (PWM) technique in which a high duty cycle corresponds to a faster rotation of the cooling fan blades, and conversely a low duty cycle corresponds to a slower rotation of the cooling fan blades. In particular, the BMC 108 may include a fan and power controller 114 as part of its functionality for individually controlling the speed of the fans 110A-110C based on a form factor and/or a quantity of the electronic components. The fans 110A-110C can operate to provide cooling to one or more electronic components, such as the CPU(s) 102, housed in the computing device 100 by removing exhaust air and drawing cool air from ambient air space of an equipment room. The rate of heat dissipation or cooling caused by the operation of the cooling fans 111A-110C depends on the rate or speed of operation of the fan blades. Therefore, in an example, the controller 114 can control the rate of heat dissipation associated with an electronic component by modulating the fan's PWM percentage.

The temperature sensors 112A-112C may measure the temperature of one or more electronic components within the computing device 100 and communicate the measurements to the BMC 108 where the measurements are received at the controller 114. The temperature sensors 112A-112C may be integrated with a component, such as the CPU(s) 102, that measures temperature and has an output signal indicating the measured temperature. In another example, the temperature sensor may be a separate chip or a component positioned on or near the electronic component it is tasked with measuring. In an example, a temperature sensor may measure electric current drawn by its electronic component at a given time to estimate the thermal output of the component. In another example, a temperature sensor may monitor air flow or air pressure near its electronic component to estimate its operating temperature.

With continuing reference to FIG. 1, the controller 114 is shown and described as being implemented by the BMC 108, but it should be understood that the controller 114 may be suitably implements by one or more other electornic components. For example, the controller 114 may be implemented by any suitable hardware, software, firmware, or combinations thereof. In an example, the controller 114 may be implemented by one or more processors and memory. The controller 114 may manage different hardware configurations and various fan speed requirements. The controller 114 may use a single ambient based fan curve to determine control input to the fans 110A-110C. The curve may be based on a form factor and/or a quantity of electronic components as a function of a quantity of supported components for that configuration of the computing device 100. In addition, the control input may be determined based on the measured temperatures of the electronic components. The quantity of electronic components may be the quantity of GPUs, CPUs, storage devices, I/O device, memory components, and/or other components of the computing device 100.

In accordance with embodiments, the controller 114 may control fans based on a quantity of electronic components, temperature, and one or more other factors. For example, the fan curve may be represented by the equation $Y=N^a+T^b+c$, where Y=fan speed (RPM), N=number of device, and T=ambient inlet temperature. a, b, and c represent various coefficients. It is noted that the equation may include additional components for determining fan speed. Also, it is noted that various other factors can be provided for the number of devices and temperature to affect the fan speed. An example of representation of this curve is depicted in FIG. 4, which is a graph depicting fan speed as a function of electronic component count and ambient temperature. More generally, for example, a curve of the fan speed may be represented by any other suitable step-wise function based on electronic component count, a measurement of the system, the like, or combinations thereof.

In accordance with embodiments, the controller 114 may control the fans based on a fan speed curve stored in memory. The fan speed curve may be a function of component type, component count, and component temperature. FIG. 2 illustrates a flow chart of an example method for controlling a fan based on a form factor and/or a quantity of electronic components in accordance with embodiments of the present disclosure. The method is described by example as being implemented by the computing device 100 shown in FIG. 1, although it should be understood that the method may be implemented by any suitable computing device having electronic components and one or more fans arranged for cooling the electronic components.

Referring to FIG. 2, the method includes determining 200 a form factor and/or a quantity of electronic components arranged for cooling by fans. For example, the controller 114 shown in FIG. 1 may receive and store in memory form factor information for the CPU(s) 102, the GPU 104, storage and I/O subsystems, and RAM 106. As an example, the form factor may include information about a physical arrangement of the electronic components with respect to the fans, a size of the electronic components, and/or the like. For example, the form factor may include information about the backplane type which would include 3.5" HDD, 2.5" HDD/

SDD, 2.5" NVMe U.2, EDSFF, and Hybrid as while as the number, capacity, and type of the storage devices. This information can be used to determine system airflow as a function of fan speeds as while as the preheat from the upstream components as a function of fan speed which can be used to determine fan speed curves as function of temperature for the configuration. The controller 114 may also receive and store information about the quantity of electronic components, such as a count total for the CPU(s) 102, the GPU 104, and RAM 106. For example the count and capacity or RAM devices could be used to determine a fan curve as function of count and temperature. As an example, the controller 114 may count the number of electronic components that are situated and arranged within the computing device.

The method of FIG. 2 includes controlling 202 the fans to distribute or circulate air to the electronic components based on the form factor and/the quantity of electronic components. Continuing the aforementioned example, the controller 114 may control the fans 110A-110C to distribute air to the CPU(s) 102, GPU 104, storage and I/O Subsystems, and RAM 106 based on the determined form factor and/or quantity of these electronic components. The controller 114 may use a fan curve, as described in examples provided herein, to determine control input to the fans 110A-110C. The curve may be based on the determined form factor and/or quantity of electronic components of the computing device 100. In this way, thermal control efficiency can be achieved while improving electronic component reliability and reduced system cooling power and sound emission.

FIG. 3 illustrates a flow chart of an example method for controlling a fan based on a form factor, a quantity of electronic components, and temperature of electronic components in accordance with embodiments of the present disclosure. The method is described by example as being implemented by the computing device 100 shown in FIG. 1, although it should be understood that the method may be implemented by any suitable computing device having electronic components and one or more fans arranged for cooling the electronic components.

Referring to FIG. 3, the method includes determining 300 a form factor and/or a quantity of electronic components arranged for cooling by fans. For example, the controller 114 shown in FIG. 1 may receive and store in memory form factor information for the CPU(s) 102, the GPU 104, storage and I/O subsytems, and RAM 106 as described in examples provided herein.

The method of FIG. 3 includes determining 302 temperature of one or more of the electronic components or of the system inlet of local ambient temperature. Continuing the aforementioned example, sensors 112A-112C may detect temperatures of CPU(s) 102, GPU 104, storage and I/O subsystems, and RAM 106, respectively. The detected temperatures may be communicated to and received by the controller 114. The controller 114 may store the detected temperatures in memory.

The method of FIG. 3 includes controlling 304 the fans to distribute air to the electronic components based on the form factor, the quantity of electronic components, and the determined temperatures. Continuing the aforementioned example, the controller 114 may control the fans 110A-110C to distribute air to the CPU(s) 102, GPU 104, storage and I/O subsystems, and RAM 106 based on the determined form factor, quantity of these electronic components, and the measured temperatures of these electronic components. The controller 114 may use a fan curve, as described in examples provided herein, to determine control input to the fans 110A-110C. The curve may be based on the determined form factor, type, capacity, quantity, and temperatures of electronic components of the computing device 100. For example, memory accessible by the BMC 108 may include fan speed curve data as represented by the graph shown in FIG. 4. With reference to FIG. 4, it is shown that the fan speed is controlled to exponentially increase as a measured temperature of the ambient air increases. Also, as indicated in the graph of FIG. 4, the fan speed is controlled to be higher for a higher number of electronic components. The controller 114 may maintain a count of electronic components in the memory for use when controlling the fan speed. In the instance that the count of an electronic component is changed (e.g., either through hot plug during run time or cold plug during a system power down), the controller 114 may adjust the fan speed based on the the new component count. Also, the data in the graph may be generated based on the physical arrangement of the electronic components with respect to the fans. With curves based on physical arrangement such as a 3.5" HDD backplane vs. an EDSFF backplane and the device count. The configuration of fan curves can be mapped statically to individual fans, to a fan mapped to other fans by a coefficient defined from 0 to 1, or to all fans (equivalent to a coefficient of 1.0 for all fans. The controller 114 can apply a PWM technique to the fans 110A-110C in accordance with the function (e.g., the function shown in FIG. 4) and based on measured temperature of the ambient air or one or more of the components. In this way, thermal control efficiency can be achieved while improving electronic component reliability and reduced system cooling power and sound emission.

The method of FIG. 3 includes controlling 306 power applied to one or more of the electronic components in response to determining that the temperature of the at least one of the electronic components exceeds the predetermined temperature. Continuing the aforementioned example, the controller 114 may control power applied to one or more of the CPU(s) 102, GPU 104, storage subsystem, and RAM 106 in response to determining that the temperature of that electronic component exceeds a predetermined temperature for that component. As an example, an operational temperature range for a component may be stored in memory. In this example, when the temperature for the component exceeds the operational temperature range, then the controller 114 may reduce performance of the electronic component for reducing its temperature. For example, if RAM temperatures exceeded thresholds, the bandwidth through the RAM may be reduced to thereby decrease the component power draw. The same approach can be used for the storage and I/O subsystems. The method may subsequently return to the step at block 302.

The present subject matter may be a computing device, a system, a method, and/or a computer program product. The computer program product may include a computer readable storage medium (or media) having computer readable program instructions thereon for causing a processor to carry out aspects of the present subject matter.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a RAM, a ROM, an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network, or Near Field Communication. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present subject matter may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++, Javascript or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present subject matter.

Aspects of the present subject matter are described herein with reference to flowchart illustrations and/or block diagrams of methods, apparatus (systems), and computer program products according to embodiments of the subject matter. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present subject matter. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the embodiments have been described in connection with the various embodiments of the various figures, it is to be understood that other similar embodiments may be used, or modifications and additions may be made to the described embodiment for performing the same function without deviating therefrom. Therefore, the disclosed embodiments should not be limited to any single embodiment, but rather should be construed in breadth and scope in accordance with the appended claims.

What is claimed is:

1. A system comprising:
    a plurality of fans configured to distribute air to a plurality of electronic components; and
    a fan controller configured to control speeds of the plurality of fans based on an exponential function of a quantity of the plurality of electronic components and a measured temperature.

2. The system of claim 1, wherein the plurality of fans are server fans.

3. The system of claim 1, wherein the fan controller comprises a processor and memory.

4. The system of claim 1, wherein the fan controller comprises a baseboard management controller (BMC).

5. The system of claim 1, wherein the controller is configured to control the plurality of fans based further on a physical arrangement of the plurality of electronic components with respect to the plurality of fans.

6. The system of claim 1, wherein the controller is configured to control the plurality of fans based further on sizes of the plurality of electronic components.

7. The system of claim 1, wherein the fan controller is configured to control the plurality of fans based further on a type of each of the plurality of electronic components.

8. The system of claim 1, wherein the plurality of electronic components are storage devices.

9. The system of claim 1, wherein the fan controller is configured to control the speed of each of the plurality of fans and a component power based on the quantity of the plurality of electronic components.

10. The system of claim 9, wherein the measured temperature is a measured ambient temperature near the plurality of electronic components.

11. The system of claim 1, wherein the fan controller is configured to:
   determine whether a temperature exceeds a predetermined temperature; and
   control a power applied to the plurality of electronic components in response to determining that the temperature exceeds the predetermined temperature.

12. A system comprising:
   a plurality of fans configured to distribute air to a plurality of storage devices; and
   a fan controller configured to:
      determine a quantity of one or more storage devices in a system;
      determine a temperature of the system; and
      control speeds of the plurality of fans based on an exponential function of the quantity and the temperature.

13. The system of claim 12, wherein the fan controller is further configured to:
   determine whether the temperature exceeds a predetermined temperature; and
   control power applied to an electronic device in response to determining that the temperature exceeds the predetermined temperature.

14. A method comprising:
   providing a plurality of fans configured to provide air to a plurality of electronic components; and
   controlling speeds of the plurality of fans based on an exponential function of a quantity of the plurality of electronic components and a measured temperature.

15. The method of claim 14, wherein the controlling the plurality of fans comprise of controlling the plurality of fans based further on sizes of the plurality of electronic components.

16. The method of claim 14, wherein controlling the plurality of fans comprise of controlling the plurality of fans based further on a type of each of the plurality of electronic components.

* * * * *